(12) United States Patent
Okamoto et al.

(10) Patent No.: US 8,607,443 B2
(45) Date of Patent: Dec. 17, 2013

(54) METHOD OF MANUFACTURING A CONNECTOR CHIP

(75) Inventors: Shinji Okamoto, Toyama (JP); Katsumi Takeuchi, Toyama (JP); Yutaka Nomura, Toyama (JP)

(73) Assignee: Hokuriku Electric Industry Co., Ltd., Toyama-Shi (JP)

( * ) Notice: Subject to any disclaimer, the term of this patent is extended or adjusted under 35 U.S.C. 154(b) by 829 days.

(21) Appl. No.: 12/827,755

(22) Filed: Jun. 30, 2010

(65) Prior Publication Data

US 2010/0266753 A1 Oct. 21, 2010

Related U.S. Application Data

(62) Division of application No. 10/595,908, filed as application No. PCT/JP2004/016847 on Nov. 12, 2004, now abandoned.

(30) Foreign Application Priority Data

Nov. 12, 2003 (JP) ................... 2003-383002

(51) Int. Cl.
H05K 3/36 (2006.01)
(52) U.S. Cl.
USPC ........................................... 29/830
(58) Field of Classification Search
USPC ............ 29/592.1, 830, 835, 844; 439/79, 86, 439/91.66, 488, 491, 567, 591, 597; 361/816, 818
See application file for complete search history.

(56) References Cited

U.S. PATENT DOCUMENTS

| | | | |
|---|---|---|---|
| 3,985,413 A | 10/1976 | Evans | |
| 5,096,426 A | 3/1992 | Simpson et al. | |
| 6,123,558 A | 9/2000 | Shibata | |
| 6,319,829 B1 * | 11/2001 | Pasco et al. | 438/678 |
| 7,342,314 B2 * | 3/2008 | Bachmann et al. | 257/758 |
| 2002/0001712 A1 | 1/2002 | Higuchi | |
| 2003/0109182 A1 | 6/2003 | Miyazawa et al. | |

FOREIGN PATENT DOCUMENTS

| | | |
|---|---|---|
| EP | 0 723 387 | 7/1996 |
| JP | 61-30978 | 2/1986 |
| JP | 63-225484 | 9/1988 |
| JP | 64-49803 | 3/1989 |
| JP | 4-63678 | 5/1992 |
| JP | 4-66780 | 6/1992 |
| JP | 4-111781 | 9/1992 |
| JP | 5-093069 | 12/1993 |

(Continued)

Primary Examiner — Paul D Kim
(74) Attorney, Agent, or Firm — Rankin, Hill & Clark LLP

(57) ABSTRACT

A method of manufacturing a connector chip includes preparing a plate-like insulating substrate material with a plurality of through hole rows arranged therein; forming a plurality of first and second base layers on opposite surfaces of the insulating substrate material; forming insulating layers between each two adjoining first base layers and between each two adjoining second base layers; forming third base layers on the one side over edge portions of the first base layers, internal surfaces of the through holes, and edge portions of the second base layers; forming fourth base layers on the other side over edge portions of the first base layers, the internal surfaces of the through holes, and edge portions of the second base layers; cutting the insulating substrate material along a middle of each of the through hole rows; and forming one or more plated layers over the first to fourth base layers.

2 Claims, 9 Drawing Sheets

(56) References Cited

FOREIGN PATENT DOCUMENTS

| | | |
|---|---|---|
| JP | 06-111869 | 4/1994 |
| JP | 07-230837 | 8/1995 |
| JP | 08-037380 | 2/1996 |
| JP | 10-199597 | 7/1998 |
| JP | 2000-077556 | 3/2000 |
| JP | 2003-282033 | 10/2003 |

* cited by examiner

METHOD OF MANUFACTURING A CONNECTOR CHIP

This is a division of application Ser. No. 10/595,908, filed Jul. 14, 2006, now abandoned.

TECHNICAL FIELD

The present invention relates to a connector chip for electrically connecting corresponding electrodes among a plurality of electrodes on two circuit substrates respectively, and a manufacturing method thereof.

BACKGROUND ART

Japanese Patent Application Laid-Open Publication No. 2000-77556 illustrates an embodiment in which a plurality of electrodes formed on a surface of a first circuit substrate and a plurality of electrodes on a second circuit substrate arranged in a semiconductor device are connected using a connector chip constituted by a plurality of spherical balls (BGA ball). At least surfaces of the BGA balls have conductivity, and the BGA balls are respectively fixed to the electrodes of the second circuit substrates arranged in the semiconductor device. Then, the semiconductor device including the BGA balls is arranged at a predetermined location on the first circuit substrate, and the BGA balls are soldered to the corresponding electrodes on the first circuit substrate, respectively. The BGA balls are spherical. Accordingly, when soldering is performed, solder gets into a gap between the spherical surface of each BGA ball and a flat surface of a corresponding one of the electrodes to a satisfactory extent. For this reason, formation of a fillet due to extrusion of the solder from the gap can be prevented. As a result, electrical shorting between the adjoining electrodes among the electrodes caused by soldering can be prevented.

Patent Document 1: Japanese Patent Application Laid-Open Publication No. 2000-77556

DISCLOSURE OF THE INVENTION

Problem to be Solved by the Invention

Since the BGA balls are spherical, they tend to roll. It is difficult to handle them. Further, in order to mount the BGA balls onto the semiconductor device or the like, a dedicated mounting device is necessary.

Accordingly, an object of the present invention is to provide a connector chip which is capable of preventing electrical shorting between adjoining electrodes and is also capable of readily connecting a plurality of electrodes on a first circuit substrate and a plurality of electrodes on a second circuit substrate without using a dedicated mounting device, and a manufacturing method thereof.

Another object of the present invention is to provide a connector chip capable of connecting a plurality of electrodes on a first circuit substrate and a plurality of electrodes on a second circuit substrate using just one connector chip or a small number of connector chips, and a manufacturing method thereof.

Means for Solving the Problem

A connector chip of the present invention comprises a rectangular parallelepiped insulating substrate having six surfaces, and a conductive path continuously formed on four continuous surfaces of the six surfaces. No conductive paths are formed on remaining two opposing surfaces of the six surfaces. With the two surfaces with no conductor paths formed thereon being opposing to the adjoining connector chips, a pair of the opposing surfaces with the conductor paths formed thereon are soldered to electrodes on a first circuit substrate and electrodes on a second circuit substrate, respectively. Thus, the electrodes on the first circuit substrate and the electrodes on the second circuit substrate are connected. Since the connector chip of the present invention has a rectangular parallelepiped shape, the connector chips do not roll unlike the conventional ones. For this reason, the electrodes on the first circuit substrate and the electrodes on the second circuit substrate can be readily connected without using a dedicated mounting device or the like. Further, since it is difficult to attach solder to the two surfaces of the connector chips where no conducting paths are formed, it is possible to prevent running of the solder along the mutually opposing surfaces of the adjoining connector chips. For this reason, electrical shorting caused by soldering between the adjoining electrodes among the electrodes can be prevented.

In a circuit device that uses connector chips of the present invention, a plurality of electrodes formed on a front surface of a first circuit substrate and a plurality of electrodes formed on a rear surface or underside of a second circuit substrate arranged above the first circuit substrate with a predetermined gap provided therebetween are electrically connected by a plurality of connector chips including conductive paths. The conductive paths and the electrodes are connected by soldering, and the gap is maintained by the connector chips. Each of the connector chips comprises a rectangular parallelepiped insulating substrate having six surfaces, and the conductive path that is continuously formed on four continuous surfaces of the six surfaces. No conductive paths are formed on remaining two opposing surfaces of the six surfaces. Incidentally, the first and second circuit substrates herein may be the discrete circuit substrates or the circuit substrates each mounted onto an electronic component or the like. As described before, the connector chip of the present invention can be readily mounted without using the dedicated mounting device or the like. Accordingly, the circuit device that uses the connector chips of the present invention can be manufactured readily and at low cost.

However, since the connector chip as described above connects one of the electrodes on the first circuit substrate and one of the electrodes on the second circuit substrate, a lot of the connector chips must be used for connection. Another connector chip of the present invention comprises a rectangular parallelepiped insulating substrate having six surfaces, and a plurality of conductive paths formed on an outer peripheral surface, which is constituted by four continuous surfaces of the six surfaces, at a predetermined interval in an opposing direction of remaining two opposing surfaces of the six surface. The plurality of conductive paths run round on the outer peripheral surface. In the so-called connector chip having multiple connections as described above, the conductive paths are formed on one connector chip. Accordingly, connection between the electrodes on the first circuit substrate and the electrodes on the second circuit substrate can be made, using one connector chip or a small number of the connector chips. For this reason, the connection can be performed at low cost.

It is preferable that, on at least a pair of the surfaces opposing to each other among the four surfaces, insulating layers having a property of repelling molten solder are formed respectively between portions of two adjoining conductive paths among the plurality conductive paths, located on the pair of the surfaces. With this arrangement, when the conductor paths are soldered to the electrodes respectively, running of the solder extruded from between the conductive paths and the electrodes along surfaces between the portions of each two adjoining paths of the conductive paths on the insulating substrate can be prevented by the insulating layers. For this reason, it is possible to prevent electrical shorting from occurring between the two adjoining electrodes.

Preferably, the insulating layers formed on one of the pair of the surfaces and the insulating layers on the other of the pair of the surfaces have different colors. With this arrangement, when the connector chip is arranged on the circuit substrate, a front and a back of the arranged connector chip can be discriminated as necessary.

It is preferable that, in the insulating substrate, a plurality of conductive-path-formed portions where the conductive paths are formed and a plurality of conductive-path-unformed portions where the conductive paths are not formed are alternately arranged along a center line so that the conductive-path-formed portions and the conductive-path-unformed portions share the center line, and that a width of each of the conductive-path-formed portions orthogonal to the center line is smaller than a width of each of the conductive-path-unformed portions orthogonal to the center line. With this arrangement, portions of each conductive path on one of the pairs of the opposing surfaces among the continuous four surfaces of the insulating substrate are exposed on the surfaces of the insulating substrate, and portions of each conductive path on the other of the pairs of the opposing surfaces are formed within depressed portions bordered by the conductive-path-unformed portions. For this reason, when the portions of each conductive path on the one of the pairs of the opposing surfaces are connected to the electrodes on the first and second circuit substrates respectively, the solder that has been extruded from between the conductive paths and the electrodes on the first circuit substrate, and from between the conductive paths and the electrodes on the second circuit substrate gets into the depressed portions bordered by the conductive-path-unformed portions, at a time of soldering. For this reason, it is possible to prevent electrical shorting caused by the solder extruded as described above.

Alternatively, the width of each of the conductive-path-formed portions orthogonal to the center line may also be formed to be larger than the width of each of the conductive-path-unformed portions orthogonal to the center line. With this arrangement, the depressed portions are formed between the adjoining conductive paths. For this reason, when the connector chip is arranged so that opening portions of the depressed portions are opposed to the first and second circuit substrates respectively, and when the conductive paths are connected to the electrodes on the first circuit substrate and the electrodes on the second circuit substrate respectively, the solder that has been extruded from between the conductive paths and the electrodes on the first circuit substrate and from between the conductive paths and the electrodes on the second circuit substrate gets into the depressed portions at a time of soldering. For this reason, it is possible to prevent electrical shorting caused by the solder extruded as described above. Each of the conductive paths may be constituted by one single layer. The conductive path may also be constituted by forming one or more plated layers over a base layer made of a metal thick film or a metal thin film. With this arrangement, by selecting a material for the plated layer appropriately, corrosion resistance and solderability of the conductive path can be improved.

The base layer may be constituted by a metal thick film of silver (Ag) or copper (Cu), or a metal thin film of a nickel (Ni)-chromium (Cr) alloy or copper (Cu). Then, the one or more plated layers may be constituted by a first plated layer made of copper (Cu) or nickel (Ni) and a second plated layer made of a tin (Sn) alloy or tin (Sn), formed over the first plated layer. With this arrangement, the corrosion resistance can be improved by the first plated layer, and the solderability can be improved by the second plated layer. Since the second plated layer is formed of the tin alloy or tin in particular, the solder free of lead can be employed. Environmental pollution caused by lead can thus be prevented.

The connector chip, in which the width of each of the conductive-path-formed portions orthogonal to the center line is smaller than the width of each of the conductive-path-unformed portions orthogonal to the center line, can be manufactured as follows: first, a plate-like insulating substrate material with a plurality of through hole rows arranged therein is prepared. Each of the through hole rows includes through holes arranged at a constant interval. Next, a plurality of first base layers are formed on one side of the insulating substrate material, and a plurality of second base layers are formed on the other side of the insulating substrate material respectively. Each of the first and second base layers is formed between each two adjoining through hole rows. The first base layers and the second base layers are each formed of a metal thick film or a metal thin film. Then, insulating layers are formed between each two adjoining first base layers and between each two adjoining second base layers respectively. Then, third base layers are formed edge portions of the first base layers located on one side, internal surfaces of the through holes, and edge portions of the second base layers located on the one side, respectively, by metal vapor deposition of a metal. Fourth base layers are then formed over edge portions of the first base layers located on the other side, the internal surfaces of the through holes, and edge portions of the second base layers located on the other side, respectively, by metal vapor deposition of a metal. Next, the insulating substrate material is cut along substantially the middle of each of the through hole rows, and then one or more plated layers are formed over the first to fourth base layers. When the connector chip is manufactured as described above, the insulating substrate material is cut along substantially the middle of each of the through hole rows. The through holes are thereby divided into a plurality of depressed portions. For this reason, the connector chip with the depressed portions formed therein can be readily mass-produced. Such cutting can be performed by forming grooves constituted by braking slits along substantially the middle of each through hole row, for example, and cutting along these breaking slits.

When the breaking slits are formed in only one side of the insulating substrate material, it is preferable that the insulating layers formed on one side of the insulating substrate material and the insulating layers formed on the other side of the insulating substrate material are made of different colors. With this arrangement, the side with the breaking slits formed therein can be readily determined according to the colors of the insulating layers.

BEST MODE FOR CARRYING OUT THE INVENTION

Figure 1:
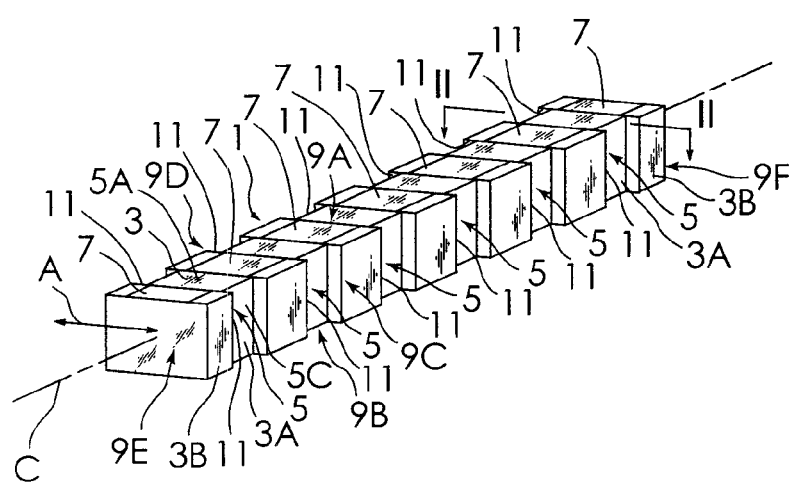
FIG. 1 is a perspective view of a connector chip according to a first embodiment of the present invention.
Figure 2:
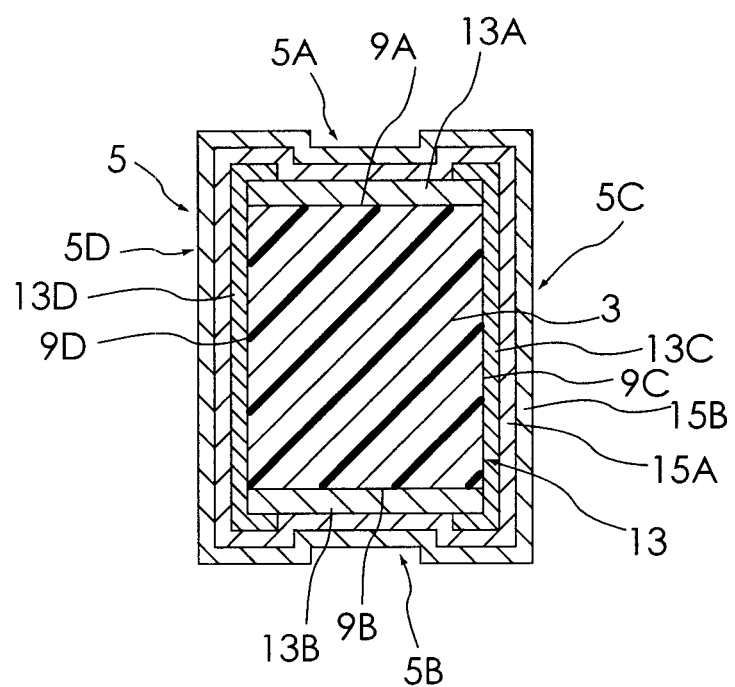
FIG. 2 is a schematic diagram showing a section taken along a line II-II in FIG. 1.

A best mode for carrying out the present invention will be described below in detail with reference to the accompanying drawings. FIG. 1 is a perspective view of a connector chip according to a first embodiment of the present invention. FIG. 2 is a schematic diagram showing a section taken along a line II-II in FIG. 1. As shown in both of the drawings, a connector chip 1 in this embodiment is constituted by forming six conductive paths 5 and 14 insulating layers 7 on a surface of an insulating substrate 3. The insulating substrate 3 is formed of ceramics including alumina of 96% (percent) by weight, and has a cross-sectional surface of a rectangular elongated shape, which expands with a center line C taken as a center thereof. With this arrangement, the insulating substrate 3 roughly has first to sixth surfaces 9A to 9F. In each of the third and fourth surfaces 9C and 9D of the insulating substrate 3 that are opposing to each other, six groove-like depressed portions 11 each with a U-shaped cross-sectional surface are formed side by side at a predetermined interval. The six depressed portions 11 formed in both sides of the insulating substrate 3 are located in positions opposing to each other on the both sides. For this reason, in this embodiment, the third and fourth surfaces 9C and 9D both have an indented surface or surface having raised and depressed portions.

The six conductive paths 5 are respectively formed on an outer periphery surface constituted by the continuous four surfaces of the first surface 9A, second surface 9B, third surface 9C, and fourth surface 9D at an predetermined interval in a direction in which the remaining two surfaces, the fifth and sixth surfaces 9E and 9F are opposing to each other, so that the conductive paths 5 respectively go around the outer periphery surface at locations where the depressed portions 11 have been formed. In other words, in the insulating substrate 3, a plurality of conductive-path-formed portions 3A with the conductive paths 5 formed thereon and a plurality of conductive-path-unformed portions 3B with no conductive paths 5 formed thereon are alternately arranged side by side along the center line C so that the conductive-path-formed portions 3A and the conductive-path-unformed portions 3B share the center line C. The width of each conductive-path-formed portion 3A orthogonal to the center line C (a dimension in a direction indicated by an arrow A) is formed to be smaller than the width of each conductive-path-unformed portion 3B orthogonal to the center line C. As shown in FIG. 2, each conductive path 5 is constituted by a base layer 13, a first plated layer 15A formed over the base layer 13, and a second plated layer 15B formed over the first plated layer 15A. The base layer 13 includes a first base layer 13A formed on the first surface 9A, a second base layer 13B formed on the second surface 9B, a third base layer 13C formed on the third surface 9C to cover edge portions, located on one side, of the first base layer 13A and the second base layer 13B, and a fourth base layer 13D formed on the fourth surface 9D to cover the edge portions, located on the other side, of the first base layer 13A and the second base layer 13B. In this embodiment, the first base layer 13A and the second base layer 13B are each formed of a metal thick film using a glass-silver (Ag) paste, and the third base layer 13C and the fourth base layer 13D are each formed of a metal thin film of a nickel (Ni)-chromium (Cr) alloy or copper (Cu). Then, the first plated layer 15A is formed of copper (Cu) or nickel (Ni), and the second plated layer 15B is formed of a tin (Sn) alloy or tin (Sn). With this arrangement, the conductive path 5 includes a first conductive portion 5A formed on the first surface 9A, a second conductive portion 5B formed on the second surface 9B, a third conductive portion 5C formed on the third surface 9C, and a fourth conductive portion 5D formed on the fourth surface 9D.

Each insulating layer 7 is formed of a material having a property of repelling molten solder. In this embodiment, the insulating layer 7 is formed of an epoxy resin or glass. Seven of these insulating layers 7 are formed on the first surface 9A and the second surface 9B of the conductive-path-unformed portions 3B of the insulating substrate 3, respectively. Referring to FIG. 1, though only the insulating layers 7 on the first surface 9A are shown, the insulating layers 7 are also formed on the second surface 9B, which is the surface at the back of the first surface 9A. The insulating layer 7 has a rectangular shape, and the width of the insulating layer 7 orthogonal to the center line C (a dimension in the direction indicated by the arrow A) is formed to be slightly smaller than the width of the first conductive portion 5A of the conductive path 5. In this embodiment, the insulating layer 7 formed on the first surface 9A and the insulating layer 7 formed on the second surface 9B have different colors of black and white. Such coloring can be performed by adding a coloring matter to the epoxy resin or the glass that forms the insulating layer 7.

Figure 3:
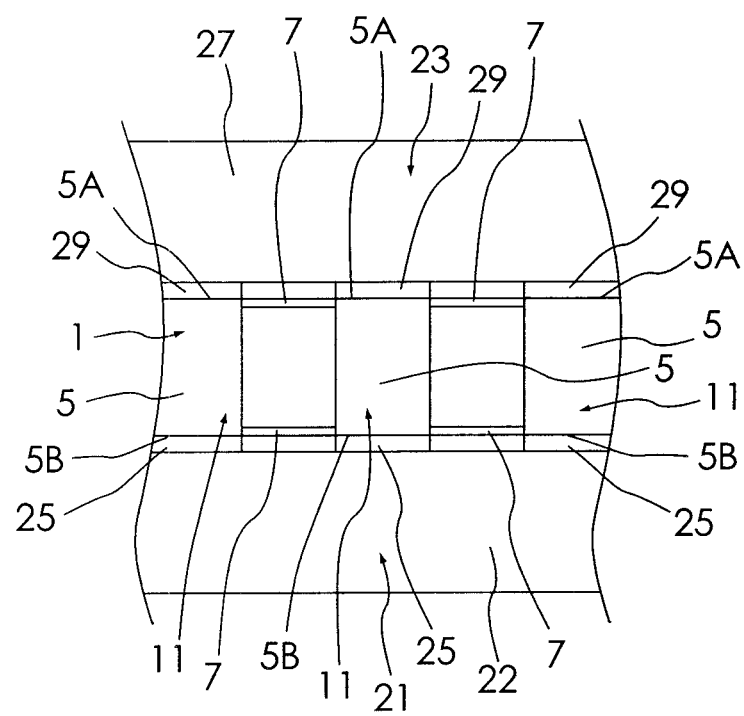
FIG. 3 is a partial view of a circuit device that uses the connector chip shown in FIG. 1, as viewed from a front thereof.

FIG. 3 is a partial view of a circuit device that uses the connector chip 1 in this embodiment, as viewed from the front thereof. This circuit device is constituted by a first circuit substrate 21, a second circuit substrate 23, and the connector chip 1. The first circuit substrate 21 is constituted by forming a plurality of electrodes 25 on a front surface of an insulating substrate 22. The second circuit substrate 23 is constituted by forming a plurality of electrodes 29 on a rear surface or an underside of an insulating substrate 27. Incidentally, the first and second circuit substrates 21 and 23 may be discrete circuit substrates, or the circuit substrates each mounted onto an electronic component or the like. The electrodes 25 on the first circuit substrate 21 and the electrodes 29 on the second circuit substrate 23 are soldered to the second conductive portions 5B and the first conductive portions 5A of the conductive paths 5 of the connector chip 1, respectively. With this arrangement, the electrodes 25 and the electrodes 29 are electrically connected through the connector chip 1, and the electrodes 29 on the second circuit substrate 23 are arranged above the first circuit substrate 21 at a predetermined gap formed by the presence of the connector chip 1.

When the connector chip 1 in this embodiment is used, and when the conductive paths 5 are soldered to the electrodes 25 and 29, respectively, running of solder extruded from between the conductive paths 5 and the electrodes 25 and from between the conductive paths 5 and the electrodes 29 along surfaces (surfaces of the insulating layers 7) between portions of each two adjoining conductive paths 5 of the insulating substrate 3 can be prevented by the insulating layers 7. For this reason, it is possible to prevent electrical shorting from occurring between the two adjoining electrodes (25, 25 or 29, 29). Part of the solder that has been extruded from between the conductive paths 5 and the electrodes 25 and from between the conductive paths 5 and the electrodes 29 gets into the depressed portions 11. With this arrangement as well, the electrical shorting caused by the solder can be prevented.

Figure 4A:
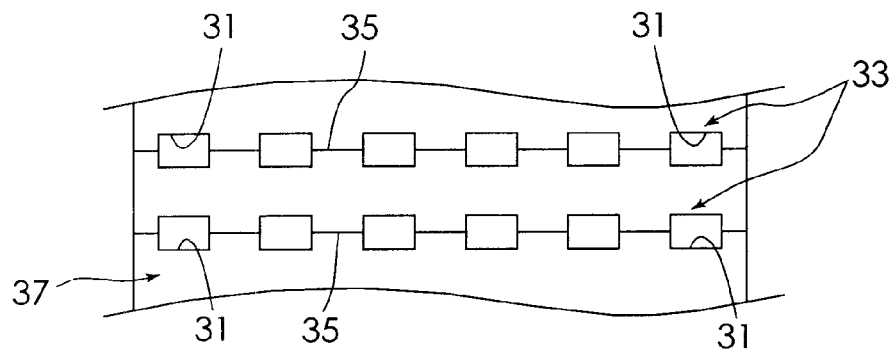
FIG. 4A is a diagram used for explaining a manufacturing method of the connector chip shown in FIG. 1.
Figure 4B:
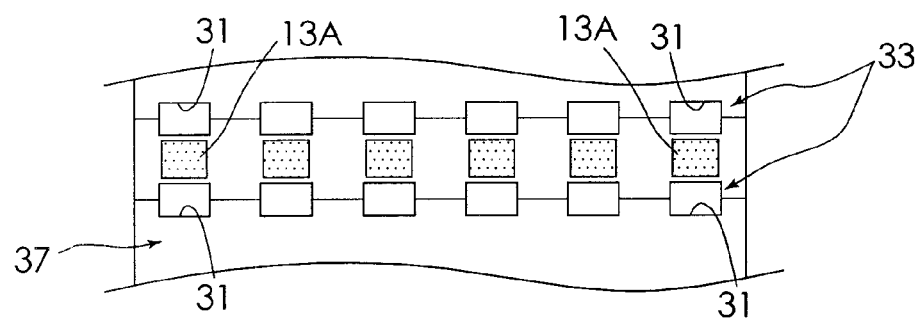
FIG. 4B is a diagram used for explaining the manufacturing method of the connector chip shown in FIG. 1.
Figure 4C:
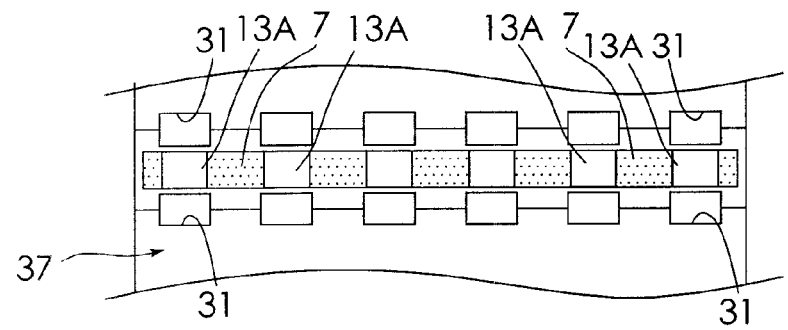
FIG. 4C is a diagram used for explaining the manufacturing method of the connector chip shown in FIG. 1.
Figure 4D:
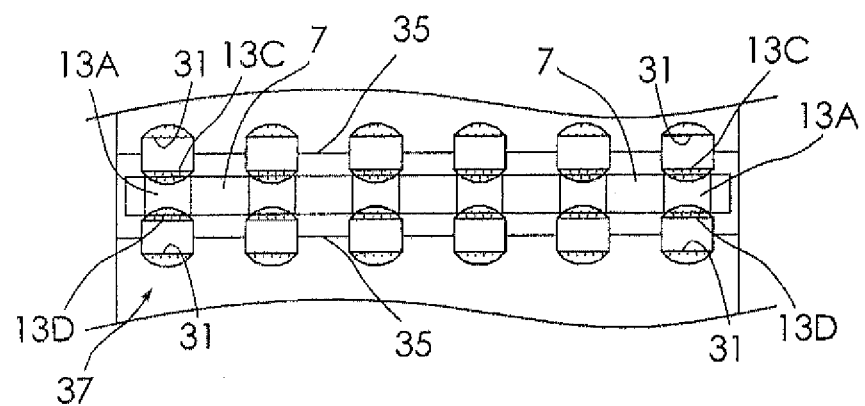
FIG. 4D is a diagram used for explaining the manufacturing method of the connector chip shown in FIG. 1.
Figure 4E:
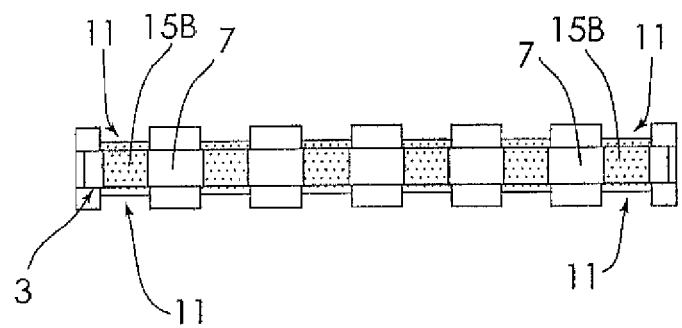
FIG. 4E is a diagram used for explaining the manufacturing method of the connector chip shown in FIG. 1.

Next, a method of manufacturing the connector chip 1 in this embodiment will be described with reference to FIGS. 4A to 4E. In order to facilitate understanding, portions that have been formed in respective steps of FIGS. 4A to 4E are displayed by dots. First, as shown in FIG. 4A, a plate-like insulating substrate material 37 is prepared. In the insulating substrate material 37, a plurality of through hole rows 33, each of which has six through holes 31 formed side by side at a constant interval, have been formed. A plurality of cutting grooves (breaking slits) 35 have been formed along substantially the middle of each through hole row 33 on both sides of the insulating substrate material 37. Next, as shown in FIG. 4B, the glass-silver (Ag) paste is used between each two of the through holes 31 positioned in each adjoining two of the through hole rows 33 to form a plurality of the first base layers 13A and a plurality of the second base layers 13B each made of a metal thick film on both sides of the insulating substrate material 37, respectively. Since FIGS. 4A to 4E are plan views all viewed from a surface side, only the first base layers 13A are drawn. However, the second base layers 13B are formed at the back of the first base layers 13A. Next, as shown in FIG. 4C, between each two adjoining two base layers 13A, 13A of the first base layer between each two adjoining base layers 13B, 13B of the second base layer, the epoxy resin or the glass is applied, thereby forming the insulating layers 7, respectively. Next, as shown in FIG. 4D, over edge portions on one side of the first base layers 13A, internal surfaces of the through holes 31, and edge portions on the other side of the second base layers 13B, vapor deposition is carried out using a metal formed of the nickel (Ni)-chromium (Cr) alloy or copper (Cu), thereby forming the third base layers 13C, respectively. Over the edge portions on the other side of the first base layers 13A, the internal surfaces of the through holes 31, and the edge portions on the other side of the second base layers 13B, the vapor deposition is carried out using the metal formed of the nickel (Ni)-chromium (Cr) alloy or copper (Cu), thereby forming the fourth base layers 13D respectively. Then, along the breaking slits 35, the insulating substrate material 27 is cut. This causes the through holes 31 to be divided, thereby forming the depressed portions 11. Next, as shown in FIG. 4E, the first plated layer 15A made of copper (Cu) or nickel (Ni) is formed over the first to fourth base layers 13A to 13D, and then the second plated layer 15B made of the tin (Sn) alloy or tin (Sn) is formed over the first plated layer 15A, thereby completing the connector chip 1.

In a manufacturing example described above, when the insulating substrate material 37 was formed, the thorough hole rows 33 were formed together with molding of the insulating substrate material. When the insulating substrate material is formed of a glass-epoxy resin, the through hole rows are formed by punching after the plate-like insulating substrate material is formed. Then, the breaking slits are formed on one side of the insulating substrate material. In this case, when the insulating layer 7 formed on the first surface 9A and the insulating layer 7 formed on the second surface 9B have different colors, the surface with the breaking slits formed therein can be readily discriminated by the colors of the insulating layers during manufacture of the connector chip.

Figure 5:
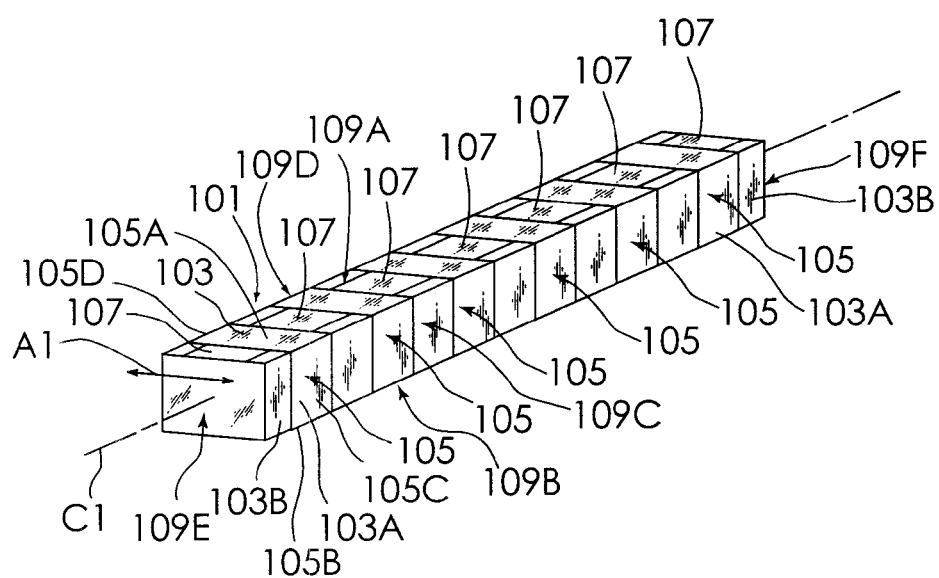
FIG. 5 is a perspective view of a connector chip according to a second embodiment of the present invention.

FIG. 5 is a perspective view of a connector chip according to a second embodiment of the present invention. A basic construction of the connector chip in this embodiment is different from that of the connector chip in the first embodiment shown in FIGS. 1 to 4 in that the depressed portions are not formed in the insulating substrate. The connector chip in this embodiment has substantially the same construction as that of the connector chip in the first embodiment in other aspects. For this reason, reference numerals obtained by adding 100 to the reference numerals assigned to the members in FIGS. 1 to 4 are assigned to the members that are the same as those of the connector chip in the first embodiment, thereby omitting a description thereof. A connector chip 101 in this embodiment is constituted by forming six conductive paths 105 and 14 insulating layers 107 on the surfaces of the insulating substrate 103. The insulating substrate 103 has a shape of a rectangular parallelepiped that extends with a center line C1 taken as a center. With this arrangement, the insulating substrate 103 has first to sixth surfaces 109A to 109F.

The six conductive paths 105 are formed on an outer periphery surface constituted by the continuous four surfaces of the first surface 109A, third surface 109C, second surface 109B, and fourth surface 109D in a direction in which the remaining two fifth and sixth surfaces 109E and 109F are opposing to each other at a predetermined interval so that each of the six conductive paths 105 goes around the outer periphery surface. In other words, the insulating substrate 103 is formed so that a plurality of conductive-path-formed portions 103 where the conductive paths 105 are formed and a plurality of conductive-path-unformed portions 103B where no conductive paths 105 are formed alternate along the center line C1 so as to share the center line C1. Each conductive path 105 includes a first conductive portion 105A formed on the first surface 109A, a second conductive portion 105B formed on the second surface 109B, a third conductive portion 105C formed on the third surface 109C, and a fourth conductive portion 105D formed on the fourth surface 109D.

Seven of the insulating layers 107 are formed on the first surfaces 109A and the second surfaces 109B of the conductive-path-unformed portions 103B of the insulating substrate 103, respectively. Each insulating layer 107 has a rectangular shape, and the width of the insulating layer 107 (a dimension in the direction of an arrow A1) orthogonal to the center line C1 is formed to be slightly smaller than the width of the first conductive portion 105A of the conductive path 105.

As with the connector chip 1 in the first embodiment, in the connector chip 101 in this embodiment, the second conductive portions 105B and the first conductive portions 105A are soldered to the electrodes of the first circuit substrate and the electrodes of the second circuit substrate, respectively.

Figure 6:
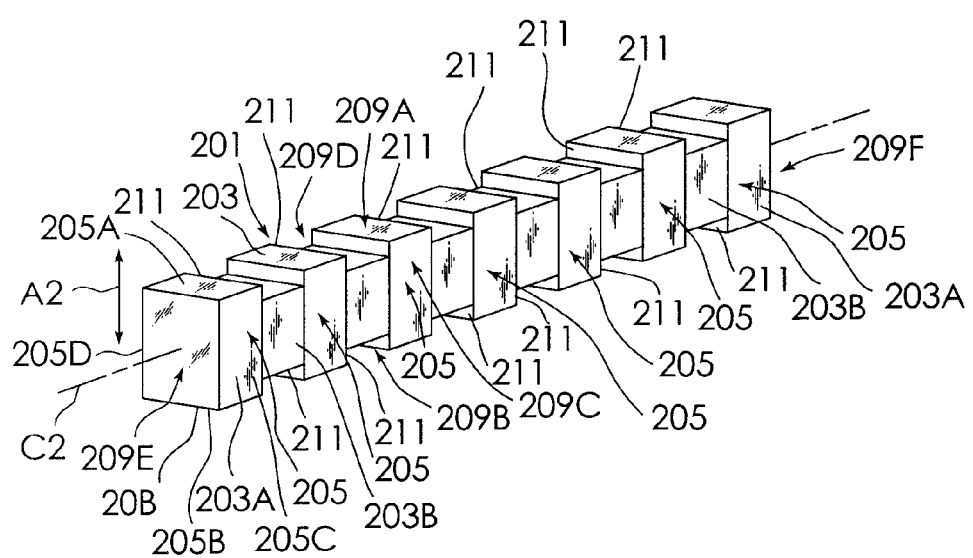
FIG. 6 is a perspective view of a connector chip according to a third embodiment of the present invention.

FIG. 6 is a perspective view of a connector chip according to a third embodiment of the present invention. A basic construction of the connector chip in this embodiment is different from that of the connector chip in the first embodiment shown in FIGS. 1 to 4 in that conductive paths are formed on an insulating substrate with no depressed portions formed therein and no insulating layers are formed. In other aspects, the connector chip in this embodiment has substantially the same construction as the connector chip in the first embodiment. For this reason, reference numerals obtained by adding 200 to the reference numerals of the members shown in FIGS. 1 to 4 are assigned to the members that are the same as those in the connector chip in the first embodiment shown in FIGS. 1 to 4, thereby omitting a description thereof. As shown in FIG. 6, a connector chip 201 in this embodiment is constituted by forming seven conductive paths 205 on a surface of an insulating substrate 203. The insulating substrate 203 has a cross-sectional surface of a rectangular elongated shape, which expands with a center line C2 taken as a center thereof. With this arrangement, the insulating substrate 203 has roughly first to six surfaces 209A to 209F. In the first and second surfaces 209A and 209B of the insulating substrate 203 that are opposing to each other, six groove-like depressed portions 211 each having a U-shaped cross-sectional surface are formed side by side at a predetermined interval, respectively. The six depressed portions 211 formed on each side of the insulating substrate 203 are formed in mutually opposing positions. For this reason, in this embodiment, the first and second surfaces 209A and 209B each have a patterned indented surface or a surface having raised and depressed portions.

The seven conductive paths 205 are formed on an outer periphery surface constituted by the continuous four surfaces of the first surface 209A, third surface 209C, second surface 209B, and fourth surface 209D at a predetermined interval, in a direction in which the remaining two surfaces of the fifth and sixth surfaces 209E and 209F are opposing to each other, so that the conductive paths 205 respectively go around the outer periphery surface at locations where the depressed portions 211 are not formed. In other words, in the insulating substrate 203, a plurality of conductive-path-formed portions 203A with the conductive paths 205 formed thereon and a plurality of nonconductive-path-unformed portions 203B with no conductive paths 205 formed thereon are alternately arranged side by side along the center line C2 so that the conductive-path-formed portions 203A and the conductive-path-unformed portions 203B share the center line C2. The width of each conductive-path-formed portion 203A orthogonal to the center line C2 (a dimension in the direction indicated by an arrow A2) is formed to be larger than the width of each conductive-path-unformed portion 203B. Each conductive path 205 includes a first conductive portion 205A formed on the first surface 209A, a second conductive portion 205B formed on the second surface 209B, a third conductive portion 205C formed on the third surface 209C, and a fourth conductive portion 205D formed on the fourth surface 209D.

In the connector chip 201 in this embodiment, the connector chip is arranged so that opening portions of the depressed portions 211 formed in the first surfaces 209A and opening portions of the depressed portions 211 formed in the second surfaces 209B face the first circuit substrate and the second circuit substrate, respectively. Then, the electrodes of the first circuit substrate and the electrodes of the second circuit substrate are soldered to the second conductive portions 205B and the first conductive portions 205A of the conductive paths 205 of the connector chip 201, respectively. When the conductive paths 205 are connected to the electrodes of the first and second circuit substrates, respectively, using the connector chip 201 in this embodiment, solder that has been extruded from between the conductive paths 205 and the electrodes on the first circuit substrate, and from between the conductive paths 205 and the electrodes on the second circuit substrate, gets into the depressed portions 211. For this reason, it is possible to prevent electrical shorting from occurring between the adjoining electrodes due to the solder extruded as described above.

Figure 7:
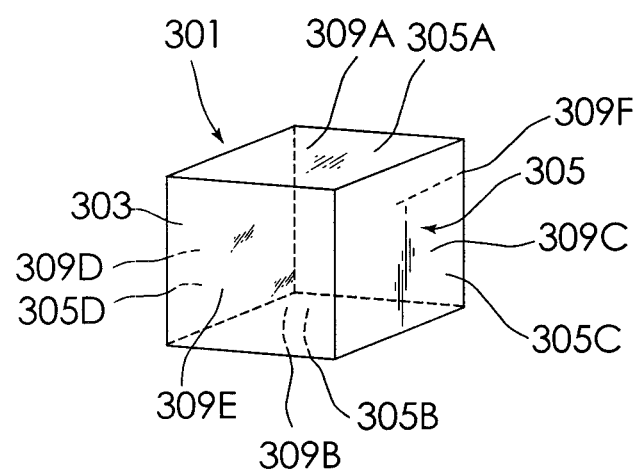
FIG. 7 is a perspective view of a connector chip according to a fourth embodiment of the present invention.

FIG. 7 is a perspective view of a connector chip according to a fourth embodiment of the present invention. As shown in FIG. 7, a connector chip 301 in this embodiment is constituted by forming a conductive path 305 on a surface of an insulating substrate 303. The insulating substrate 303 has substantially a cubic shape. With this arrangement, the insulating substrate 303 includes first to six surfaces 309A to 309F.

The conductive path 305 is continuously formed on an outer periphery surface constituted by four surfaces of first to fourth surfaces 309A to 309D. As in the connector chip in the first embodiment, this conductive path 305 is constituted by a base layer, a first plated layer formed over the base layer, and a second plated layer formed over the first plated layer. The conductive path 305 includes a first conductive portion 305A formed on the first surface 309A, a second conductive portion 305B formed on the second surface 309B, a third conductive portion 305C formed on the third surface 309C, and a fourth conductive portion 305D formed on the fourth surface 309D. By formation of the conductive path 305 as described above, the conductive path 305 is not formed on the remaining two surfaces 309E and 309F that are opposing to each other.

Figure 8:
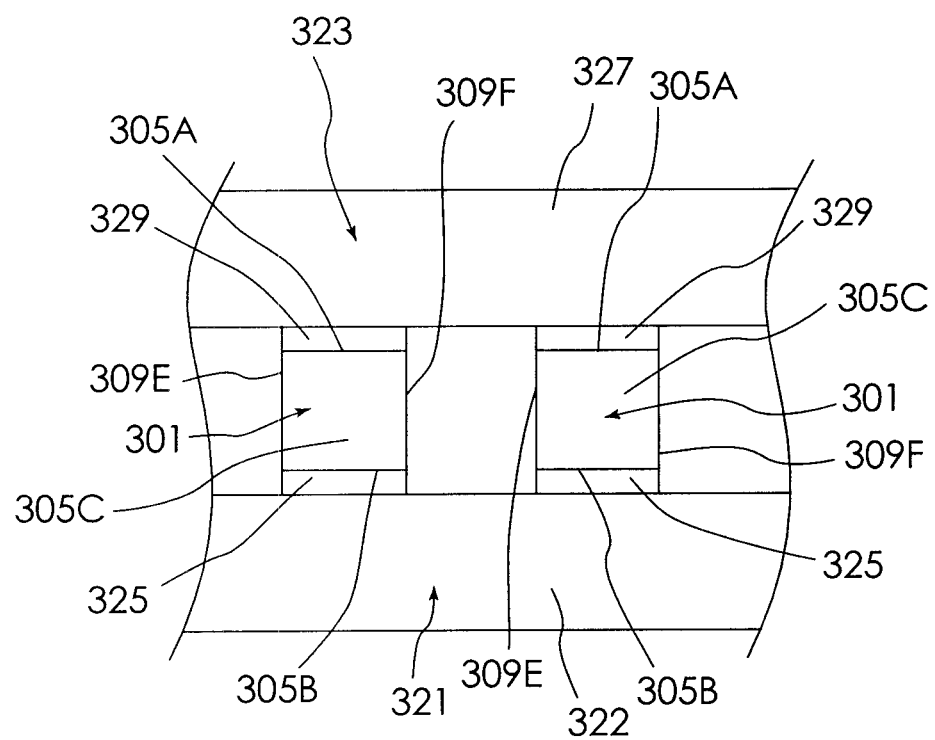
FIG. 8 is a partial view of a circuit device that uses the connector chip shown in FIG. 7, as viewed from a front thereof.

FIG. 8 is a partial diagrammatic view of a circuit device that uses the connector chip 301 in this embodiment, viewed from the front thereof. This circuit device is constituted by a first circuit substrate 321, a second circuit substrate 323, and a plurality of the connector chips 301. When the connector chips 301 in this embodiment are used, a lot of the connector chips 301 are used for connection of electrodes, being different from a case where the connector chip in the first, second, or third embodiment is used. The first circuit substrate 321 is constituted by forming a plurality of electrodes 325 on a surface of an insulating substrate 322. The second circuit substrate 323 is constituted by forming a plurality of electrodes 329 on an underside of an insulating substrate 327. The electrodes 325 on the first circuit substrate 321 and the electrodes 329 on the second circuit substrate 323 are soldered to the second conductive portions 305B and the first conductive portions 305A of the conductive paths 305 of the connector chips 301, respectively. Each connector chip 301 is arranged so that the two surfaces 309E and 309F with no conductive paths 305 formed thereon face the adjoining connector chips 301, respectively.

In the connector chip 301 in this embodiment, it is difficult to attach solder to the two surfaces 309E and 309F with no conductive path formed thereon. Accordingly, running of the solder along the mutually opposing surfaces of the adjoining connector chips 301 can be prevented. For this reason, it is possible to prevent electrical shorting between the adjoining electrodes 325 and electrical shorting between the adjoining electrodes 329, caused by soldering.

INDUSTRIAL APPLICABILITY

Since the connector chip of the present invention has a rectangular parallelepiped shape, the connector chip does not roll unlike the conventional connector chips. For this reason, the electrodes on the first circuit substrate and the electrodes on the second circuit substrate can be readily connected without using a dedicated mounting device or the like. Further, it is difficult to attach the solder to the two surfaces of the connector chip where no conductive paths are formed. Thus, running of the solder along the mutually opposing surfaces of the adjoining connector chips can be prevented. Therefore, it is possible to prevent electrical shorting from occurring between the adjoining electrodes among the electrodes caused by soldering.

What is claimed is:

1. A method of manufacturing a connector chip comprising:
   preparing a plate-like insulating substrate material with a plurality of through hole rows arranged therein, each of the through hole rows including through holes arranged at a constant interval;
   forming a plurality of first base layers on one of both surfaces of the insulating substrate material, and a plurality of second base layers on the other of the both surfaces of the insulating substrate material, each of the first and second base layers being formed between each two of the through holes respectively located in each two adjoining through hole rows, the first base layers and the second base layers being formed of a metal thick film or a metal thin film;
   forming insulating layers between each two adjoining first base layers and between each two adjoining second base layers, respectively, the insulating layers having a property of repelling molten solder;
   forming third base layers over edge portions of the first base layers located on one side, internal surfaces of the through holes, and edge portions of the second base layers located on the one side, respectively, by metal vapor deposition;
   forming fourth base layers over edge portions of the first base layers located on the other side, the internal surfaces of the through holes, and edge portions of the second base layers located on the other side, respectively, by metal vapor deposition;
   cutting the insulating substrate material along substantially a middle of each of the through hole rows; and
   forming one or more plated layers over the first to fourth base layers.

2. The method of manufacturing a connector chip according to claim 1, wherein the insulating layers formed on one side of the insulating substrate material and the insulating layers formed on the other side of the insulating substrate material are made in different colors; and
   breaking slits are formed along substantially the middle of the each of the through hole rows in one side of the insulating substrate material, and the insulating substrate material is cut along the breaking slits.

* * * * *

UNITED STATES PATENT AND TRADEMARK OFFICE
CERTIFICATE OF CORRECTION

| | | |
|---|---|---|
| PATENT NO. | : 8,607,443 B2 | Page 1 of 1 |
| APPLICATION NO. | : 12/827755 | |
| DATED | : December 17, 2013 | |
| INVENTOR(S) | : Okamoto et al. | |

It is certified that error appears in the above-identified patent and that said Letters Patent is hereby corrected as shown below:

On the title page, Related U.S. Application Data item (62), delete "10/595,908" and insert --10/595,809--.

In the Specification

Column 1, Line 4, delete "10/595,908" and insert --10/595,809--.

Signed and Sealed this
Fifteenth Day of April, 2014

Michelle K. Lee
*Deputy Director of the United States Patent and Trademark Office*